(12) United States Patent  (10) Patent No.: US 7,915,898 B1
Kraemer  (45) Date of Patent: Mar. 29, 2011

(54) INTEGRATED CABLE/CONNECTOR SHIELDING SURVEILLANCE SYSTEM

(75) Inventor: John G. Kraemer, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 274 days.

(21) Appl. No.: 12/284,535

(22) Filed: Sep. 23, 2008

(51) Int. Cl.
*G01R 31/02* (2006.01)
(52) U.S. Cl. .......................... 324/527; 324/627
(58) Field of Classification Search ............ 324/527, 324/627, 628, 544
See application file for complete search history.

(56) References Cited

U.S. PATENT DOCUMENTS

| 4,647,844 | A  | * | 3/1987 | Biegon et al. ............ 324/627 |
| 6,777,947 | B2 | * | 8/2004 | McCoy et al. ............ 324/449 |

* cited by examiner

*Primary Examiner* — Vincent Q Nguyen
(74) *Attorney, Agent, or Firm* — Matthew J. Evans; Daniel M. Barbieri

(57) ABSTRACT

A system determining whether the shielding on a shielded signal or power cable has been compromised without the need of detaching the cable. A special-made cable is used with a dedicated shielding surveillance conductor and a process for injecting a known current on the shield of the cable and monitoring a voltage on the shielding surveillance conductor.

11 Claims, 10 Drawing Sheets

INTEGRATED CABLE/CONNECTOR SHIELDING SURVEILLANCE SYSTEM

FIELD OF THE INVENTION

The present invention generally relates to a cable shielding for mission critical systems.

BACKGROUND OF THE INVENTION

In the past, it is well known that many defense systems must operate through intense electro-magnetic environments with a very high level of reliability and availability. Damage to cable/connector system shielding can result from personnel pulling on the cable with excessive force, vehicle traffic over the cable, rodents, inadvertent abrasion or cutting during system deployment, exposure to the climatic environment, and intentional actions.

Often, long cables must have a high level of shielding to protect the signal and/or conductors from susceptibility to external electro-magnetic fields and threats. Cables are considered long when their length is significant with respect to the wavelength ($\lambda$) associated with the high frequency contained in an electro-magnetic threat. Long cables (e.g. $\lambda/20$) act as "good antennae", which may allow the transfer of radiated energy to voltages and currents at signal and power connector pins of equipment. Damage to shielding on long cable/connector systems may thus allow the introduction of damaging voltages and currents at equipment connector pins. Threatening electromagnetic fields may be produced by transmission of radio frequency energy, lightning, static discharge and radio frequency energy from radio transmitters.

An example exists with modern aircraft electronics which must continue to operate without incidence to allow continuous safe flight while being exposed to high electro-magnetic fields. The long signal cable/connector systems that link the various avionics and navigation equipment must maintain a high level of shielding to ensure immunity to equipment damage and/or data loss due to exposure to such fields. Consider, for instance, a fly-by-wire system. If there is some damage to the cable/connector system shielding, the flight control system may still perform flawlessly in the benign electro-magnetic environment. But if the aircraft flies near a high intensity source of electro-magnetic radiation, such as a ground-based Voice of America transmitter antenna, data, and hence flight control, could be lost.

Common approaches to addressing cable/connector system reliability center on frequent inspection. Other approaches center around "over-design" of electronic equipment such that performance does not rely heavily on cable shielding. This approach has recently become used in commercial air transport aircraft. A prior art copper Ethernet switch is an example where this approach proved expensive with respect to schedule and cost. To address possible cable shield degradation or damage, aircraft manufactures have required Ethernet switches to be tested for RF susceptibility with high-speed Ethernet cable shields disconnected from ground.

Another approach to address cable/connector system reliability is to route the shielded cables inside rigid structures to protect them from damage, or providing another or auxiliary layer of shielding should the shielded cable's shield become damaged. The "rigid structure" may be metallic conduit (pipe) or a shielding compartment (a room with continuous metal on all six sides).

Current state of the art for cable shielding verification involves disconnecting the cable from equipment and measuring inductance and/or resistances of the cable/connector system's shield. Of course, this could be difficult in tight spots, and infallibility of this method is questioned since low inductance and/or low resistance does not always equate to a high level of shielding integrity. These methods may not allow the equation of voltages and currents at equipment connector pins that may result from such electro-magnetic fields.

Consequently, there exists a need for improved methods and systems for efficiently improving assurances of continued integrity of mission critical electronics of the type having long cables especially during occasions of exposure to high levels of electro-magnetic fields.

SUMMARY OF THE INVENTION

It is an object of the present invention to provide a system and method for efficiently improving the integrity of mission critical electronics.

It is a feature of the present invention to utilize an integrated cable/connector shielding surveillance system.

It is another feature of the present invention to include a new cable having therein a dedicated surveillance conductor.

It is yet another feature of the present invention to utilize a surveillance module at one end of a long cable under surveillance and a termination of the surveillance conductor at the opposing end.

It is still another feature of the present invention to include a cable current monitor probe.

It is still another feature of the present invention to include a cable RF signal injection probe.

It is an advantage of the present invention to improve the ability to accurately detect a cable shield damage or degradation situation and thereby reduce the workload associated with inspection of long cable/connector systems.

The present invention is a system and method for monitoring the shielding and cable/connector systems, which invention is designed to satisfy the aforementioned needs, provide the previously stated objects, include the above-listed features, and achieve the already articulated advantages.

Accordingly, the present invention is a system and method including a cable containing a dedicated surveillance conductor therein and a surveillance module at one end of the cable, as well as a monitor probe and an injection probe.

DETAILED DESCRIPTION

Figure 1:
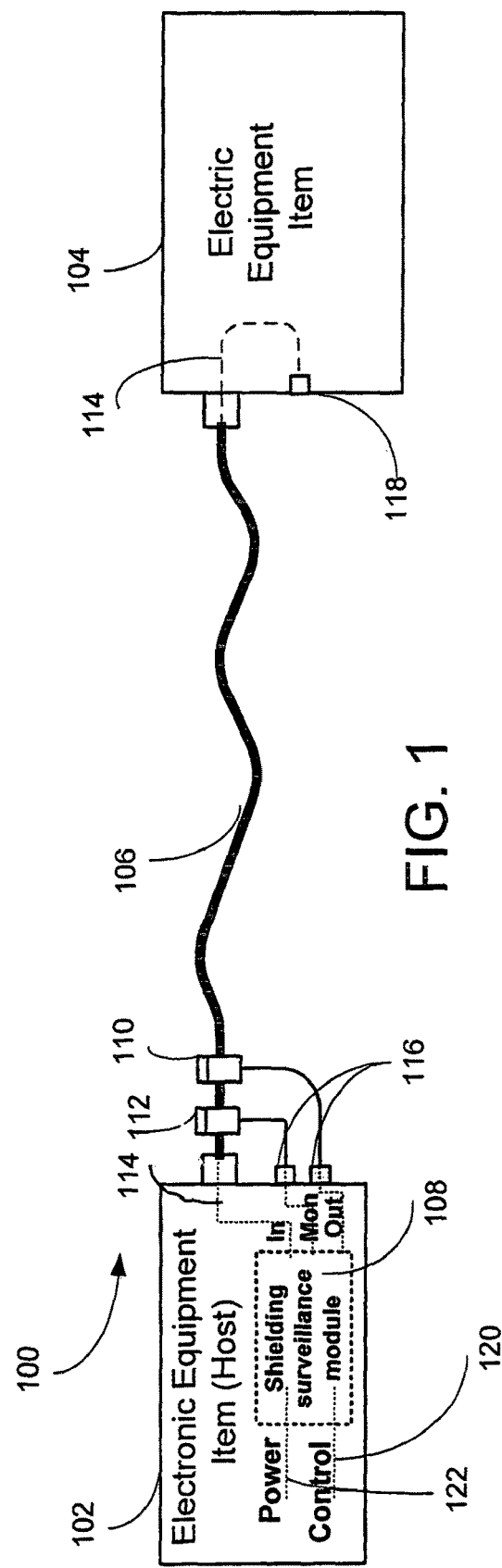
FIG. 1 is a simplified block diagram of an embodiment of the present invention showing a cable/connector system of the present invention.

Now referring to FIG. 1, there is shown a simplified block diagram of an embodiment of the present invention showing a cable/connector system of the present invention, generally designated 100, which includes a host electronic equipment item 102, which could be any type of electronic equipment which gets connected to other pieces of electronic equipment and where a high level of assurance of shield integrity is highly valued, including, but not limited to, avionics equipment and defense communication and control equipment. Host electronic equipment item 102 is shown coupled to interfacing electronic equipment item 104 via shielded connecting cable 106. It should be noted that whenever the term shielded connecting cable 106 is discussed herein it is intended to include the cable, connectors and cable shield terminations. Shielded connecting cable 106 is a special cable with special characteristics. Shielded connecting cable 106 is coupled in several ways to shielding surveillance module 108, which is an electronic module that resides inside host electronic equipment item 102 that the shielded connecting cable 106 connects to. Shielding surveillance module 108 produces a signal to drive the shield current injection probe 110 and measures the resulting voltages from the shield current monitor probe 112 and shielding surveillance conductor 114 (preferably having its own independent insulation as shown) at each test frequency. Shielding surveillance module 108 compares the measurements to expected values to determine if the shielding of shielded connecting cable 106 is still acceptable. Shielding surveillance module 108 interfaces to allow loading of probe data and pass/fail data, as well as presenting results. Control and I/O interfaces via 120 may be implemented locally at the host electronic equipment item 102 or may be implemented remotely through a computer network. The shielding surveillance module receives power from the host electronic equipment item, batteries or an external source via 122. Shield current injection probe 110 could be a current transformer driven by the shielding surveillance module 108 that inductively couples current on to the shield of shielded connecting cable 106 under surveillance or another method (such as directly injecting current) could be used as well. Shield current injection probe 110 may be a portable clamp-on device, or it may be permanently attached/integrated with the shielded connecting cable 106. Shield current injection probe 110 could be made from a commercially available product and could be calibrated to yield coupling or transfer factors as a function of frequency. Shield current monitor probe 112 is a current transformer that produces an output voltage across a specified impedance that is proportional to the current on the cable shields enclosed by its aperture. Shield current monitor probe 112 may be a portable clamp-on device, or it may be permanently attached/integrated with the shielded connecting cable 106. Shield current monitor probe 112 could be made from a commercially available probe and could be calibrated to yield coupling factors as a function of frequency. Shielding surveillance conductor 114 could be an insulated conductor that is added inside the shielded volume (under the shield(s) of interest) during manufacture of the shielded connecting cable 106. It should be understood that the electrically conductive shield contemplated by this invention could contain 1 or more than two layers and would as is well known in the art have some sort of insulating sleeve as an outermost covering. Shielding surveillance conductor 114 is placed under the shields 202 and 204 (FIG. 2) and should be uniformly controlled such that its characteristic impedance with respect to the shields 202 and 204, which represents the shielding system under surveillance, remains constant along the length of shielded connecting cable 106. Shielding surveillance conductor 114 can terminate through connector pins to the shielding surveillance module 108 at one end and to the surveillance conductor termination 118 at the interfacing equipment. The termination of the shielding surveillance conductor 114 could be a resistive load between the surveillance conductor and the ground reference of cable shields 202 and 204. The termination resistance could be equal to the characteristic impedance of the shielding surveillance conductor 114. Shielding surveillance connectors 116 could be two coaxial connectors added to the host electronic equipment item 102 chassis, with one being for the shield current injection probe 110 and the other for the shield current monitor probe 112. Control can be provided to shielding surveillance module 108 via equipment to shielding surveillance module control interface 120 while power is provided via equipment to shielding surveillance module power line(s) 122.

While it is believed that shielding surveillance module 108 is best constructed as an internal module hosted by an electronic equipment unit, it should be understood that shielding surveillance module 108 could be external to the host electronic equipment item 102 and, for example, could be battery powered and contained in an application specific connector at the ends of shielded connecting cable 106. Such specialized connector could have also included therein indicator lights to display the status of the shielding of the shielded connecting cable 106 or otherwise display the results of the surveillance.

Figure 2:
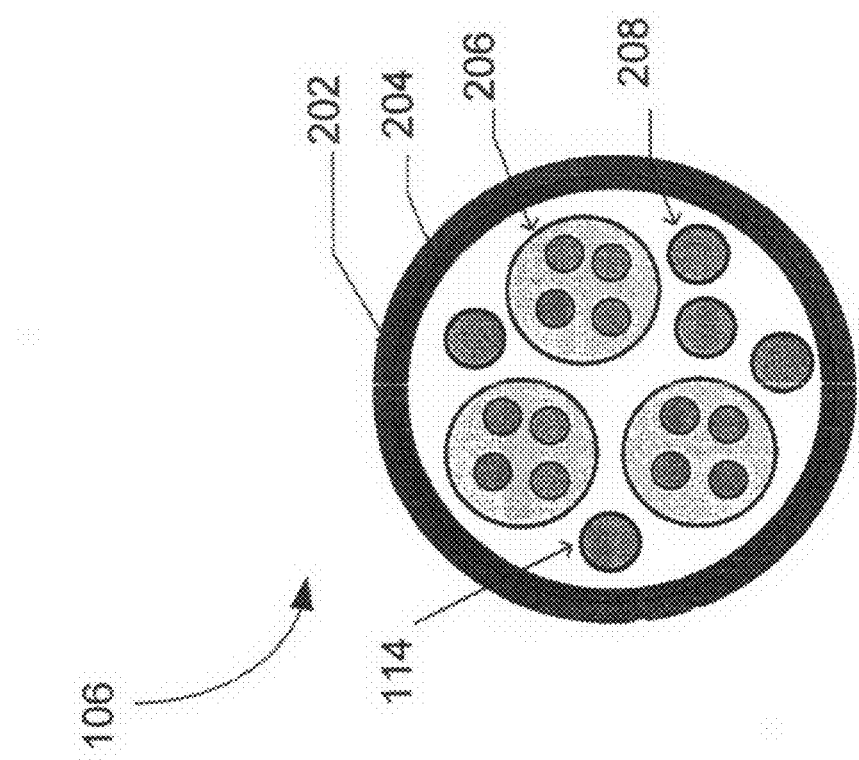
FIG. 2 is a cross-sectional view of the cable taken on line 2-2 of FIG. 1.

Now referring to FIG. 2, there is shown a cross-sectional view of shielded connecting cable 106 taken on line 2-2 of FIG. 1. Shielded connecting cable 106 is shown having an item 202 which could be an insulating sleeve or a connecting cable outer shield with an insulating outer sleeve and possibly an insulating inner sleeve as well, disposed around a connecting cable inner shield 204, which could be electrically conductive metallic shields which are well known in the art to provide shielding from electromagnetic fields of high strengths. Disposed inside the shielded volume of shielded connecting cable 106 are shown three (3) independent shielded wire groups 206. These are representative, and it should be understood that more or less than three (3) shielded wire groups 206 could be included, as well as other shielded internal cables having more or fewer than four insulated wires for carrying power and signals therein. Also shown is power and low speed signal wires 208 which are representative of the various other insulated, but unshielded wires that may be disposed within the shielded volume provided by connecting cable outer shield 202 and connecting cable inner shield 204. Shielded connecting cable 106 differs from well-known shielded cables by the inclusion of shielding surveillance conductor 114.

Figure 3:
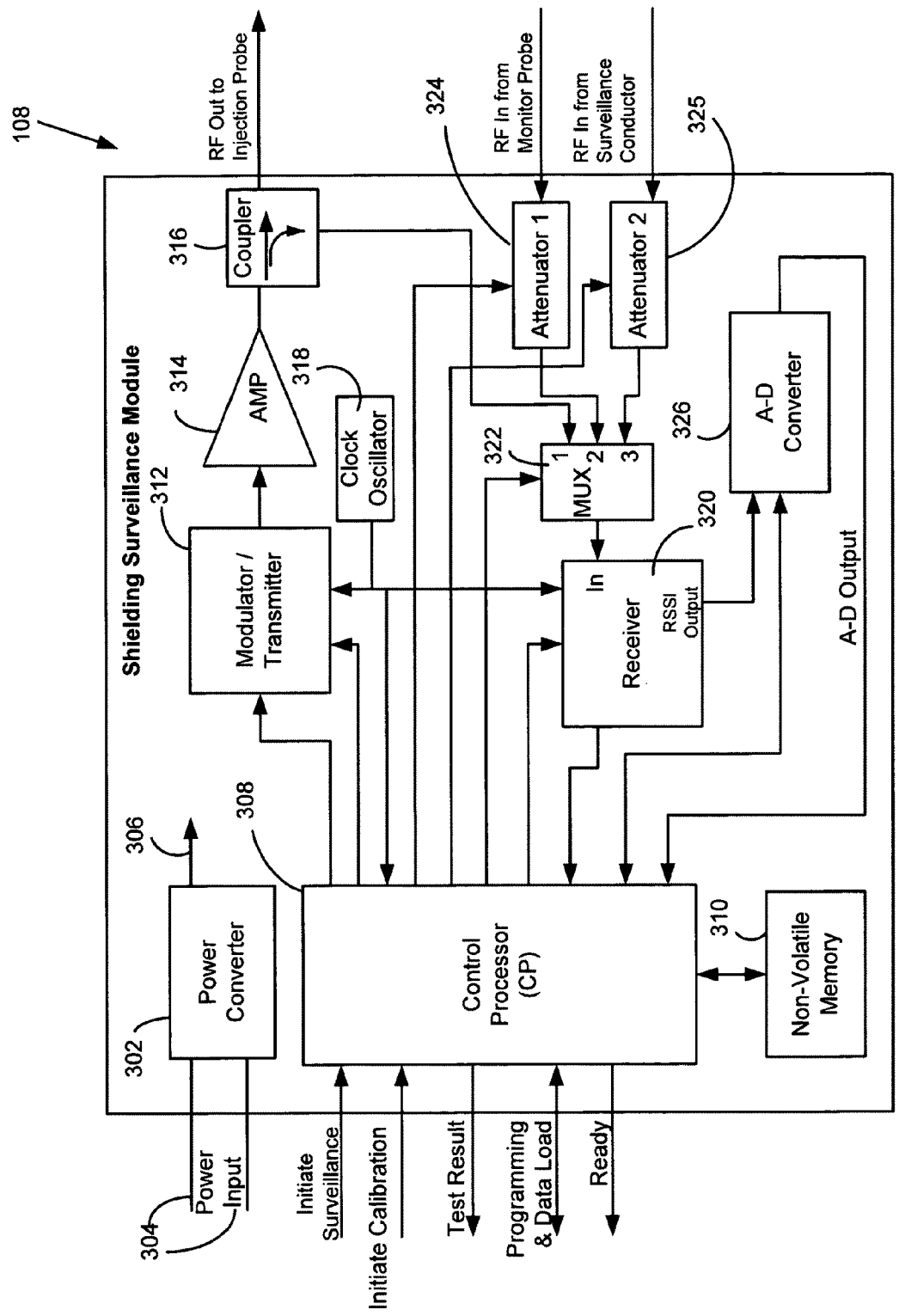
FIG. 3 is a more detailed block diagram of the shielding surveillance module of FIG. 1.

Now referring to FIG. 3, there is shown a view of the shielding surveillance module 108 of FIG. 1 which includes a power converter 302 which receives power from power input 304 and provides DC power to output 306 to module components. For drawing simplicity, the power connections are omitted, but it is understood that a person skilled in the art would readily know how to make the requisite connections.

Also shown is the control processor 308, which is the main processor of the shielding surveillance module 108. Control processor 308 is built around a microcontroller that provides operator and programmer data input and output interfaces to the host electronic equipment item 102, direct network connections or via other means. Control processor (CP) 308 also controls the circuits inside the shielding surveillance module 108 and performs the necessary mathematical calculations to set up and control internal circuits, process measurement data and determine surveillance test results. CP is coupled to non-volatile memory 310, which could contain the operating program for the control processor 308 and data relating to the specific application. Non-volatile memory 310 is controlled, read from and written to via control processor 308.

Modulator/transmitter 312 outputs a frequency shift keyed (FSK) signal with characteristics (e.g. frequency, frequency deviation) as directed by the control processor. Of course, other modulation schemes could be used as well. The output is modulated with message data provided by the control processor. A popular frequency range for testing shields of data and power cables is 30 MHz to 450 MHz, using at least four frequencies per octave. The FSK deviation is set to be relatively small with respect to the test frequency, while being kept as large as possible to increase sensitivity at the receiver.

Amplifier 314 is a broadband radio frequency amplifier capable of driving the injection probe with the modulator/transmitter output at a level high enough to allow adequate shielding measurement dynamic range while not being too great as to cause interference, as a result of the injected current on the cable under surveillance, to near-by equipment. The typical output level may be 10 milliwatt.

Self-test enabling coupler 316 allows a small portion of the amplifier's RF output to be sent to the multiplexer (MUX) and receiver if selected, to allow performance of a module self-test.

Receiver 320 demodulates the FSK signal received via the monitor probe and surveillance conductor and outputs the data message to the control processor. It also provides an output voltage that is proportional to its RF input. This output is called the Receive Signal Strength Indicator (RSSI).

Mux 322 is a switch that allows selection of one of three inputs to be sent to the receiver for signal strength measurement and message data extraction.

Programmable attenuator 1 324 allows the level of the input signal from the monitor probe to be reduced to a level that allows maximum accuracy from receiver. Its setting (amount of attenuation provided) is considered by the control processor when computing shield current.

Programmable attenuator 2 325 allows the level of the input signal from the shielding surveillance conductor 114 to be reduced to a level that allows maximum accuracy from receiver. Its setting (amount of attenuation provided) is considered by the control processor 308 when computing surveillance conductor voltage.

Analog-to-digital converter 326 converts the receiver 320's RSSI output voltage to an equivalent digital value that is sent to the control processor 308 for processing.

Also shown is clock oscillator 318 which provides a stable frequency base for the control processor 308 and the frequency synthesizer in the modulator/transmitter 312 and receiver 320.

Figure 4:
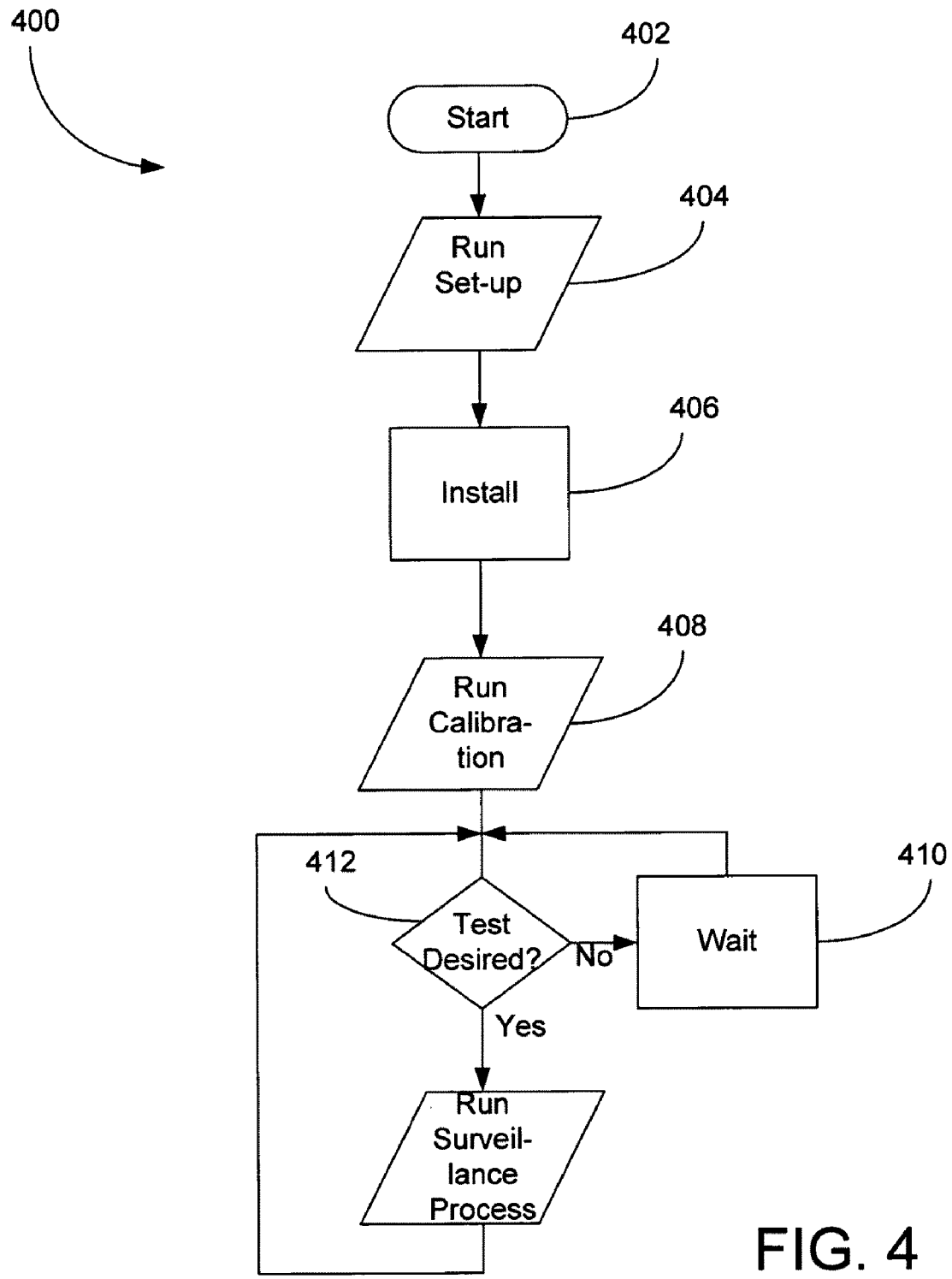
FIG. 4 is flow diagram of the overall method of the present invention.

Now referring to FIG. 4, there is shown a flowchart of the innovative process of the present invention.

Step 402: The entire process of the present invention is begun here and broken into several independent processes.

Figure 5:
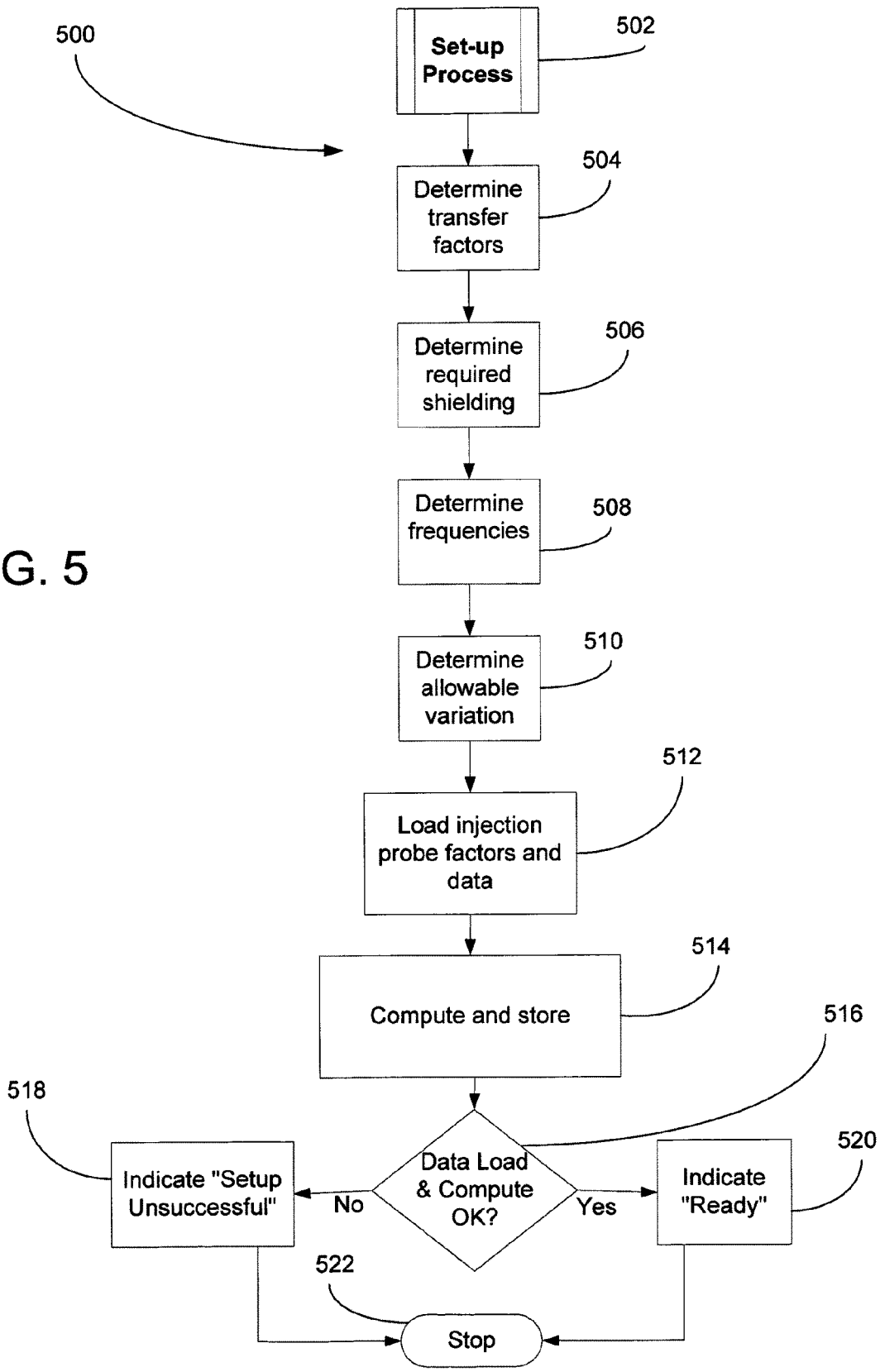
FIG. 5 is a flow diagram of the set-up process shown in FIG. 4.

Step 404: The set-up process may be run with the shielding surveillance module 108 installed in host electronic equipment item 102 or before installation of the shielding surveillance module 108 into the host electronic equipment item 102. The details of the set-up process are shown in FIG. 5 and discussed in the text associated with FIG. 5.

Step 406: The next overall step is to install the shielding surveillance module 108, shield current injection probe 110, shield current monitor probe 112, and connect shielded connecting cable 106 and other cables.

Figure 6A:
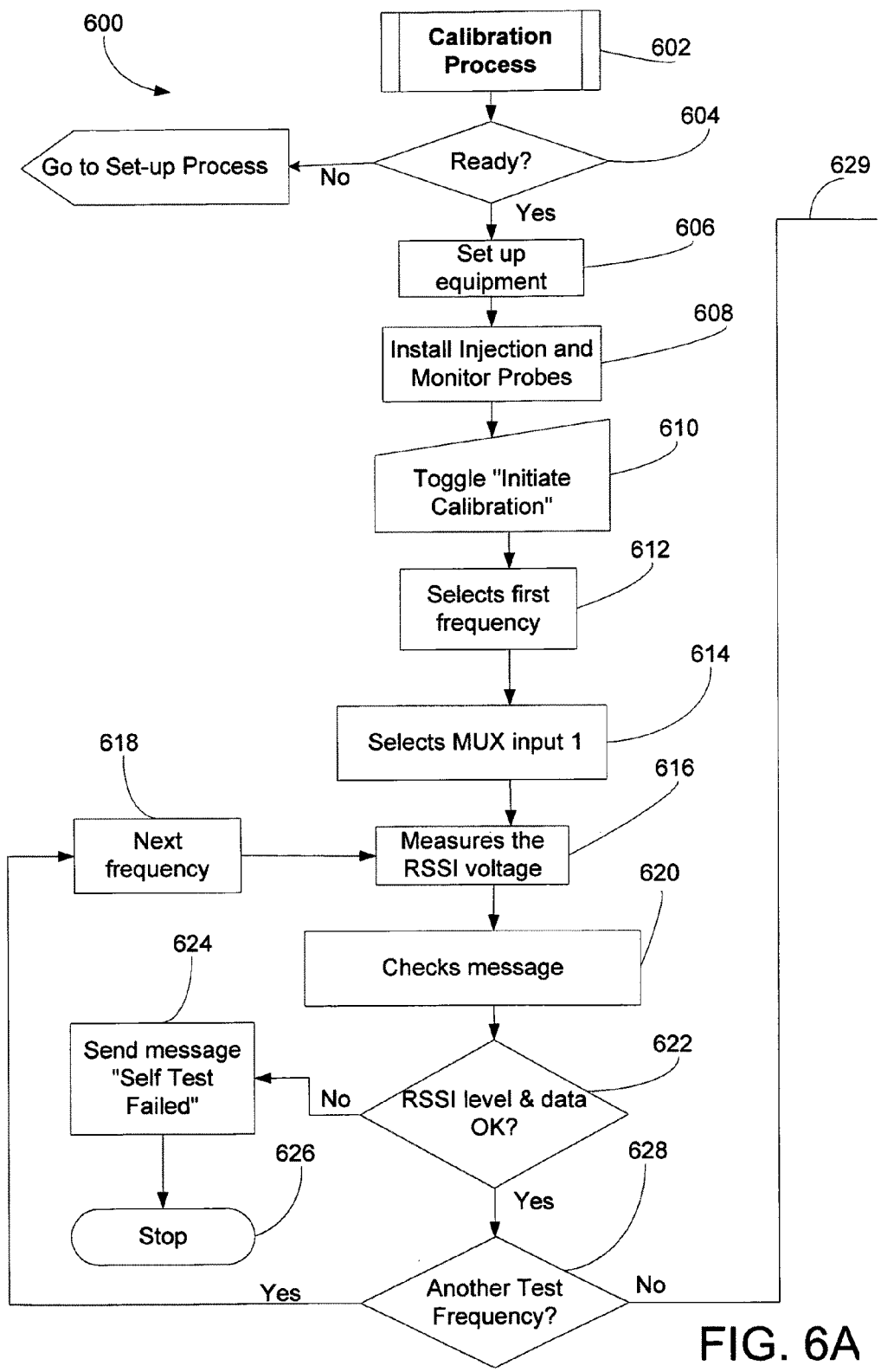
FIG. 6A is a flow diagram of initial stages of the calibration process shown in FIG. 4 with a transition line 629.
Figure 6B:
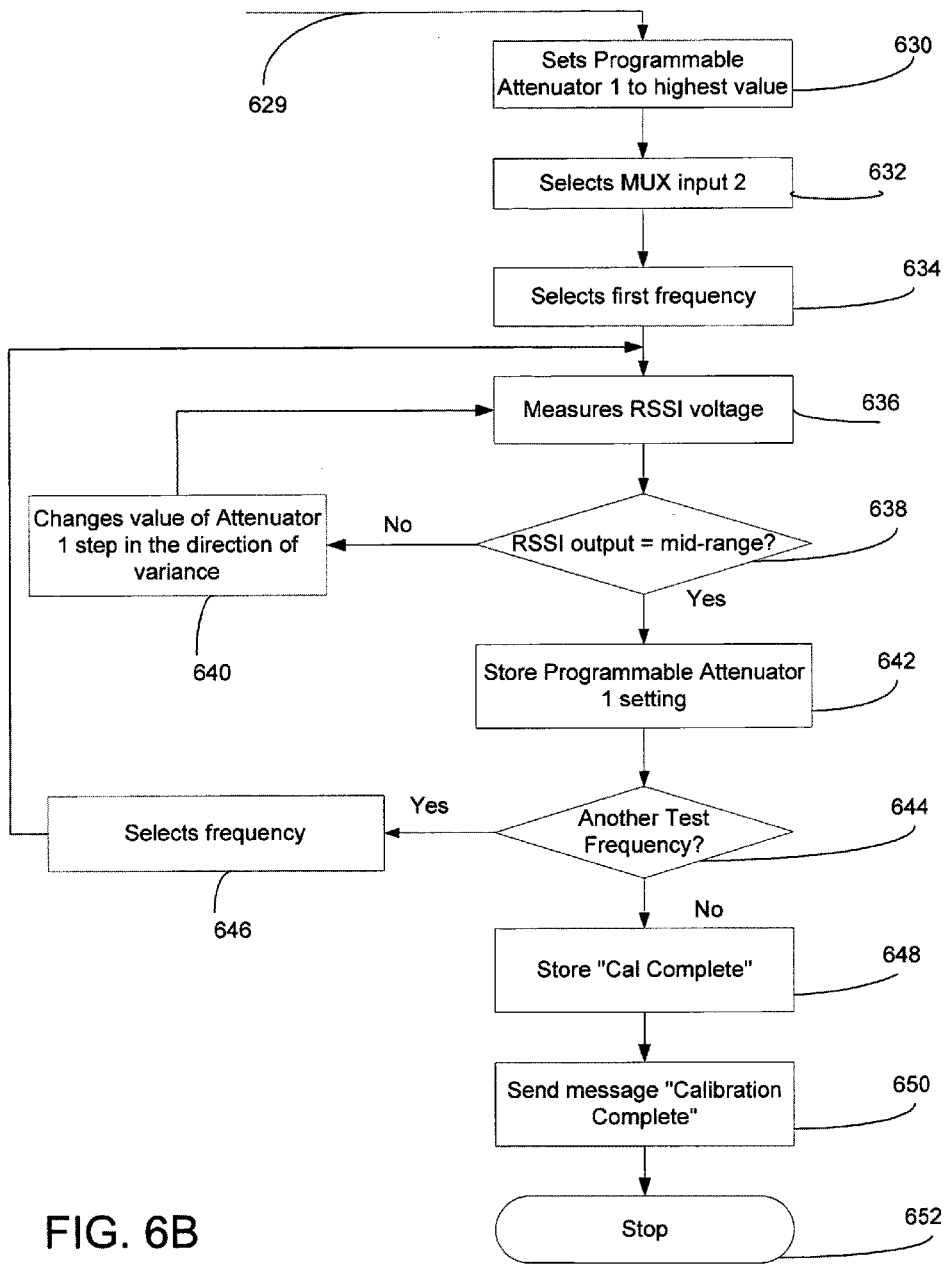
FIG. 6B is a flow diagram of final stages of the calibration process shown in FIG. 4 with the transition line 629.

Step 408 is to run the calibration process which is shown in detail in FIGS. 6A and 6B and discussed in the associated text.

Step 412 is to determine if a surveillance test is desired.

If Step 412 is NO, then WAIT per Step 410.

Figure 7A:
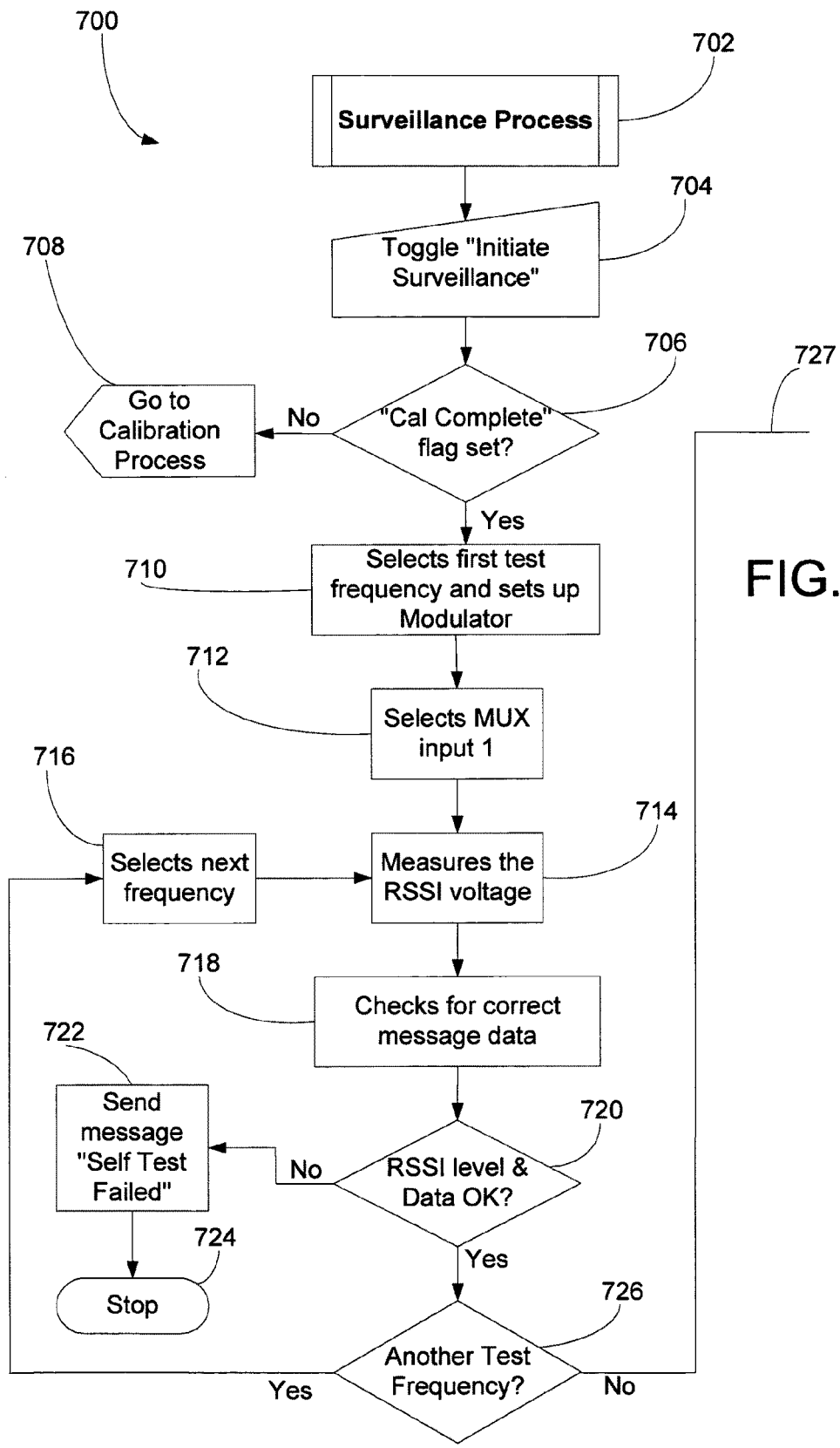
FIG. 7A is a flow diagram of initial stages of a surveillance process shown in FIG. 4 with a transition line 727.
Figure 7B:
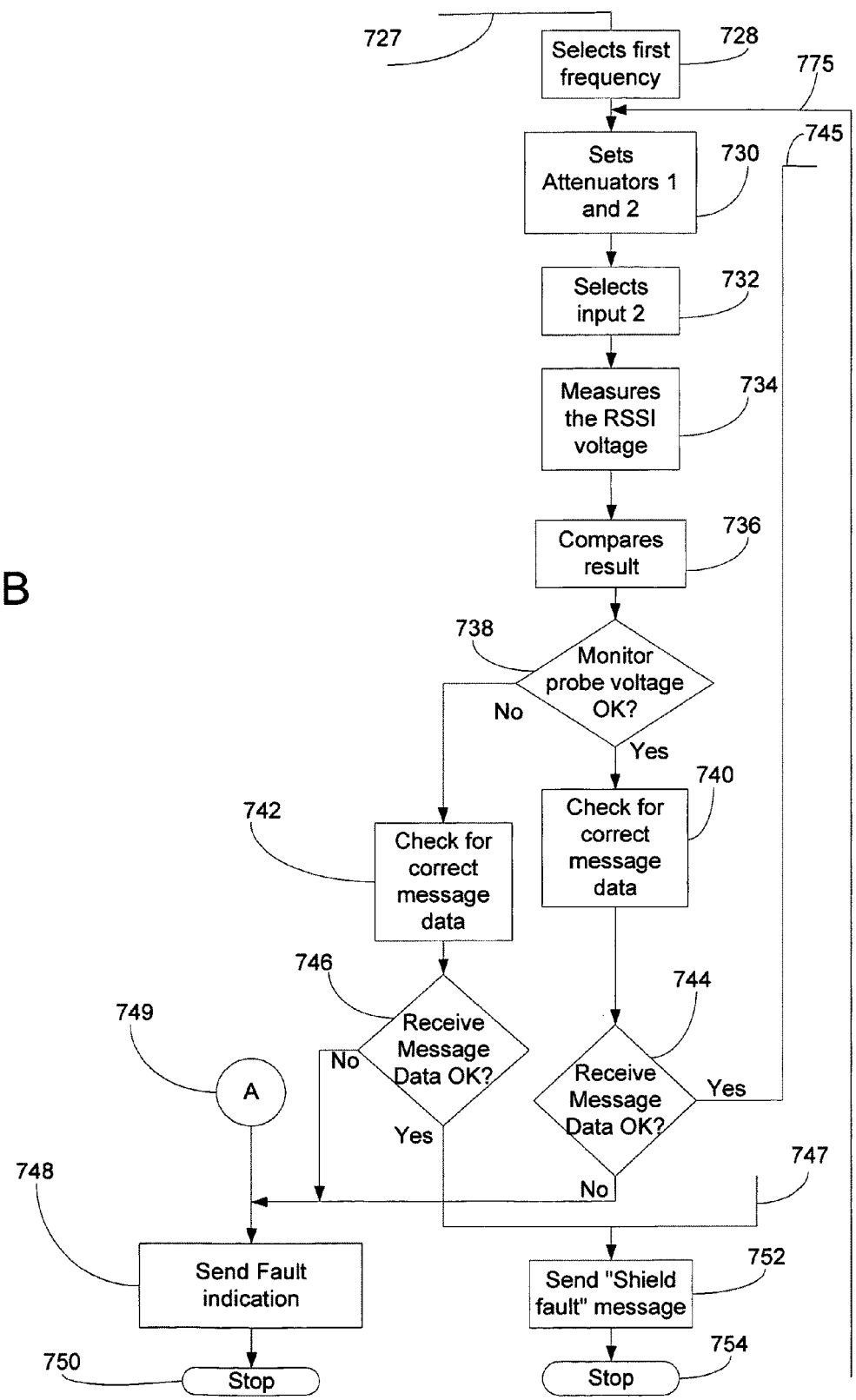
FIG. 7B is a flow diagram of intermediate stages of a surveillance process shown in FIG. 4 with transition lines 727, 745, 747, and 775.
Figure 7C:
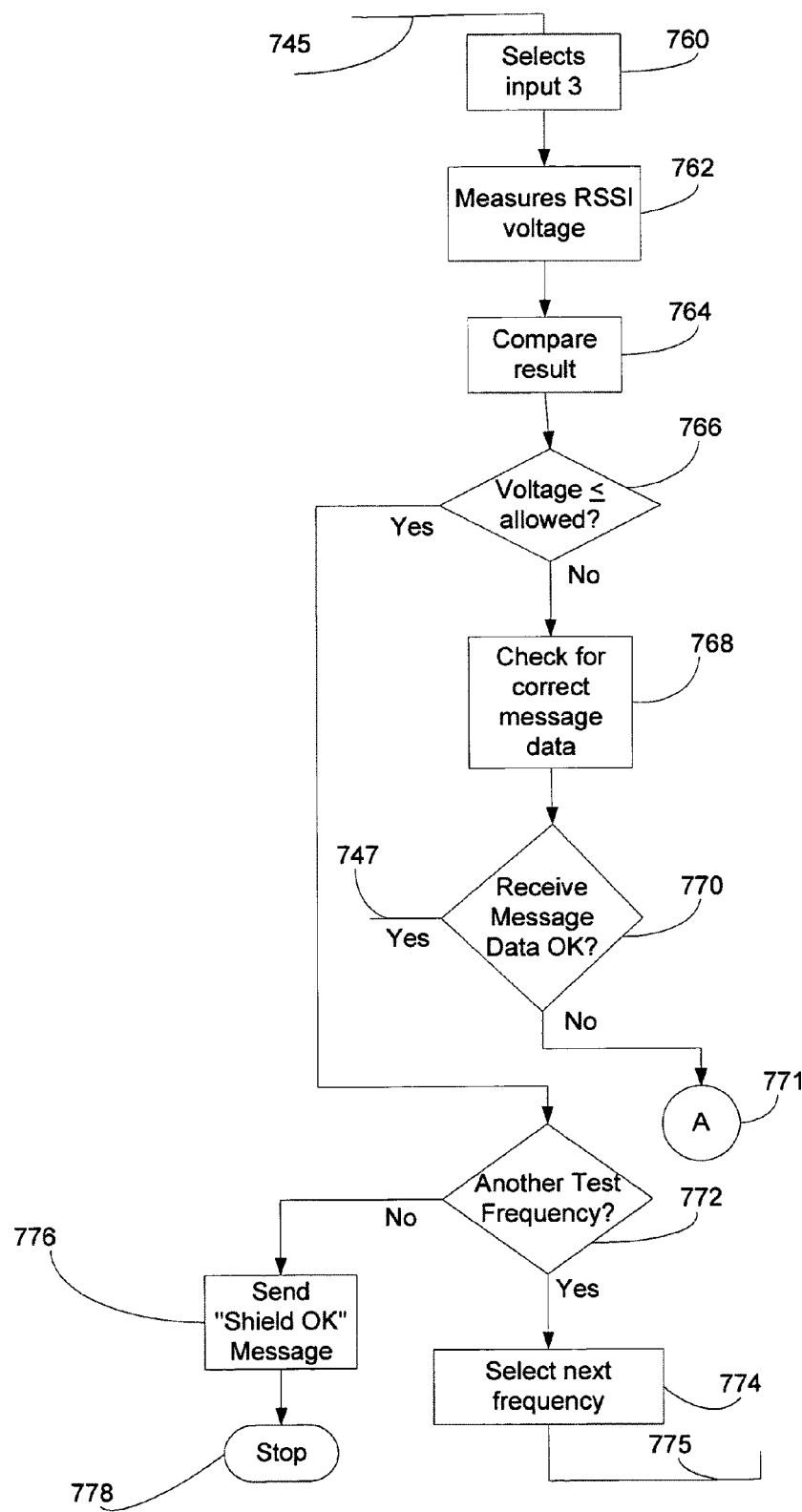
FIG. 7C is a flow diagram of final stages of a surveillance process shown in FIG. 4 with transition lines 745, 747, 775.

If Step 412 is YES, then run the surveillance process which is described in FIGS. 7A-7C.

Now referring to FIG. 5, there is shown a flowchart of the Set-Up process of the present invention generally labeled 500, including a starting point 502.

Step 504 is to determine transfer factors for the shield current injection probe 110 and shield current monitor probe 112. These transfer factors may be obtained from the manufacturer as a function of frequency or by calibration.

Step 506 is to determine the required shielding for the shielding surveillance conductor 114. Shielding is measured in dB, and is defined as 20 log [Shield current in amperes/voltage on surveillance conductor in volts]. Shielding may be a function of frequency.

Step 508 is to determine test frequencies. A popular frequency range for testing the outer shields of signal and power cables is 30 MHz to 450 MHz, using at least 4 frequencies per octave. It may be best to not choose frequencies equal to those produced by the signals in the cable if it is desired to test when the cable is actively carrying data traffic.

Step 510 is to determine allowable variation in cable shield current at shield current monitor probe 112. In addition to variation caused by faults in the cable shield, shield-to-connector bonding, and connector-to-chassis bonding, shield current may vary due to changes in equipment electrical bonding and cable position, in particular, if the cable is routed near (within 10 cm of) metallic structures.

Step 512 is to load injection probe factors and required shielding data (determined above) at each test frequency into the control processor 308 via the programming and data load port. The programming and data load port 122 may be a port implemented via a connector on the surveillance module 108 that temporarily interfaces to a computer, or it may be an interface with the host electronic equipment item 102's processor/controller to allow activity via the host equipment or a computer network.

Step 514 is to have control processor 308 compute and store in non-volatile memory 310 attenuator settings and the allowable ranges of inputs from the shield current monitor probe 112 and shielding surveillance conductor 114 at each test frequency. A value check may be performed by the CP 308 to determine if the inputs are reasonable and can allow valid computations.

Step 516 is to determine if the data load and computation is OK. If YES, then Step 520 is to indicate READY on ready line. Test Result and Ready output lines may connect to indicator lamps or may send data to the host equipment's processor/controller, or may send data over a computer network. If NO, then per step 518, indicate SET-UP UNSUCCESSFUL via the programming and data load port.

Step 522 is to Stop.

Now referring to FIGS. 6A and 6B, there is shown the calibration process generally designated 600, which includes a starting block 602 and Step 604, which is to check for readiness. If Ready is indicated, then proceed to step 606; if NOT Ready is indicated, then go to set-up process (FIG. 5). Step 606 is to set up equipment and cables with shielding surveillance module 108 installed in host electronic equipment item 102, if not already done.

Step 608 is to install shield current injection probe 110 and shield current monitor probe 112, if not already integral with the assembly of shielded connecting cable 106 or previously installed.

Step 610, Toggle "initiate calibration" line, the action may be performed as a manual toggle/push button switch, remotely via an equipment internal processor/controller, or remotely over a computer network via the control interface 120.

Step 612: Control processor 308 selects first test frequency and sets up modulator/transmitter 312 and receiver 320. Setup includes frequency selection and output of continuous test message from the control processor 308 to the modulator/transmitter 312 for Frequency Shift Keying (FSK) modulation. FSK deviation set to be relatively small with respect to selected test frequency, while being kept as large as possible to increase sensitivity of the receiver 320.

Step 614 is to have control processor 308 select MUX input 1 for Self-test mode.

Step 616 is to have analog-to-digital converter 326 measure the RSSI voltage and report results to control processor 308.

Step 620 is to have control processor 308 check if RSSI is in tolerance and for correct message data at receiver output. This process is to verify that the module is outputting the correct power and that the message data transmit and receive features are operational.

Step 622 is to determine if RSSI and Data are OK. If yes, proceed to Step 628 which is to determine if there is another test frequency. If Step 622 returns a NO, then proceed to step 624, which is to send message "Self Test Failed" on test result output line. Then stop.

If there is another test frequency per step 628, then proceed to step 618, which is where the control processor 308 selects next test frequency and loops back to step 616.

If there are no other test frequencies, then proceed along line 629 to FIG. 6B and to step 630, which is to have control processor 308 set programmable attenuator 1 324 to highest value, then to step 632, which is to have control processor 308 select MUX input 2 to allow measurement of shield current monitor probe 112 output. Then go to step 634, which is to have control processor 308 select first test frequency and set up modulator/transmitter 312, then to step 636 is to have analog-to-digital converter 326 measure the RSSI voltage and report the results to control processor 308. Receive Signal Strength Indicator (RSSI) is a voltage proportional to the power level at the input of the receiver 320.

Step 638 is to decide whether the RSSI output is Midrange. If YES, then proceed to step 642. If NO, then proceed to step 640, which is to have control processor 308 change value of programmable attenuator 1 324 step in the direction of the variance and then go back to Step 636. If the RSSI output is midrange, then per step 642, the next step is to store programmable attenuator 1 324 setting and measured RSSI for that frequency in non-volatile memory 310. Then on to step 644, where it is determined whether there is another test frequency. If YES, then proceed to step 646, where the control processor 308 selects the next test frequency and sets programmable attenuator to highest value the loops back to Step 636. If there are no other test frequencies, then proceed to Step 648, which is to Store "Cal Complete" flag in non-volatile memory 310, then to proceed to 650, which is to send message "Calibration Complete" on test result output line, which is part of 120. Then to Stop—Step 652.

Now referring to FIGS. 7A, 7B and 7C, there is shown a flowchart of the innovative surveillance process of the present invention generally designated 700, which includes a start Step 702 and a Step 704 which is to toggle "initiate surveillance" line. The next step is Step 706, which is to determine if "Cal Complete" flag has been set. If NO, proceed to Calibration process and FIGS. 6A and 6B. If YES, then proceed to Step 710, which is to have control processor 308 select first test frequency from non-volatile memory 310 and setup modulator/transmitter 312 and receiver 320. Step 712 has control processor 308 selecting MUX input 1 for self-test mode. Step 714 has analog-to-digital converter 326 measuring the RSSI voltage and reporting the results to control processor 308. Step 718 is to have control processor 308 check if RSSI is in tolerance and for correct message data at receiver output.

Step 720 is to determine if RSSI and Data are OK. If NO, then per Step 722, Send Self Test Failed message on Test result output line (part of interface 120) and then stop. If YES, then determine if there is another frequency. If YES, then per Step 726, proceed to Step 716, where the control processor 308 selects next test frequency and proceeds to Step 714. If no other test frequency exists, then proceed along line 727 to FIG. 7B and to Step 728, which is to have control processor 308 select first test frequency and set up modulator/transmitter 312 and receiver 320. Then proceed to Step 730, which is to have control processor 308 set programmable attenuators 1 and 2—324 and 325 respectively, and retrieve calibration data from non-volatile memory 310. Then on to Step 732, which is to have control processor 308 select input 2 (monitor probe voltage) on MUX. Then on to Step 734, which is to have analog-to-digital converter 326 measure the RSSI voltage and report the results to control processor 308. Step 736 is to compare result from monitor probe voltage to calibration value with tolerance in non-volatile memory 310. Step 738 is to determine whether the monitor voltage is OK. If YES, then proceed to step 740; if NO, then branch off to Step 742. Step 742 is to check for correct message data at receiver output; if NO, then per Step 746, proceed to Step 748 and Send message "Cable/connector system shield fault or fault indication due to external noise sources, Check Set-up" on Test result output line. Then to Stop—Step 750.

In order to accurately confirm a shield fault, an out-of-tolerance monitor probe voltage (indicates change in how the current flows on the shield) and/or a surveillance conductor voltage greater than the allowed amount (indicates excessive leakage through the shield), must be correlated to the injected signal at one or more of the test frequencies. The injected signal is modulated with a data message that the receiver should be able to detect if the received signal(s) are above the amount allowed to indicate good shielding. High-level uncorrelated received signals may be due to noise from near-by sources. At that point, the measurement setup and cable should be checked.

Step 740 is to check for correct message data at receiver output and per step 744, determine if receive message data is OK. If YES, then proceed along line 745 to FIG. 7C to Step 760. If NO, then proceed to Step 748.

In Step 746, if YES, the message data was received OK, then proceed to Step 752, which is send message "Cable/Connector System Shield Fault" on test result output line and then stop, per Step 754.

Now referring to FIG. 7C, there is shown Step 760 where the control processor 308 selects input 3 (surveillance Conductor voltage) on MUX. Then to Step 762, where analog-to-digital converter 326 measures RSSI voltage and reports the result to control processor 308, then to Step 764, which is to compare result (from surveillance conductor voltage) to maximum allowed voltage previously stored in non-volatile memory 310. Then proceed to Step 766, where you determine whether the surveillance conductor voltage is less than or equal to the allowed maximum. If YES, proceed to step 772. If NO, then proceed to Step 768, which is to check for correct message data at receiver output and then to Step 770, which is to determine whether the receive message data is OK. If YES, proceed along line 747 to FIG. 7B to Step 752. If NO, then proceed to Transfer Point A 771, which is coupled to Transfer point 749 on FIG. 7B and then to Step 748.

Step 772 determines whether another test frequency exists. If YES, then proceed to Step 774, where the control processor 308 selects next test frequency from non-volatile memory 310 and sets up modulator/transmitter 312 and receiver 320. Then along line 775 to Step 730 in FIG. 7B. If NO, then to Step 776, which is Send message "Cable/connector system shield OK" on test result output line. Then to Stop 778.

It is thought that the method and apparatus of the present invention will be understood from the foregoing description and that it will be apparent that various changes may be made in the form, construct steps, and arrangement of the parts and steps thereof, without departing from the spirit and scope of the invention or sacrificing all of their material advantages. The form herein described is merely a preferred exemplary embodiment thereof.

I claim:

1. A system for transmitting information in environments capable of exposure to high level electro-magnetic fields, the system comprising:
    a first electronic unit;
    a second electronic unit;
    a cable disposed between and connecting said first electronic unit and said second electronic unit, said cable further comprising:
    a first wire;
    a dedicated surveillance conductor wire;
    an electrically conductive shield disposed around both said first wire and said dedicated surveillance conductor wire,
    means for injecting a signal onto the electrically conductive shield;
    means for monitoring a current flowing through the electrically conductive shield and determining whether said current is as a result of injection of a signal by said means for injecting a signal; and
    means for monitoring a voltage characteristic on said dedicated surveillance conductor wire and for making a determination as to a shielding capacity of said electrically conductive shield,
    wherein said means for injecting, said means for monitoring a current, and said means for monitoring a voltage in combination further comprises a shared shielding surveillance module disposed in said first electronic unit.

2. A system of claim 1 wherein said means for monitoring a voltage further is configured to determine if connection status between said first electronic unit and said second electronic unit exceeds a predetermined minimum threshold.

3. The system of claim 1 wherein said means for injecting, said means for monitoring a current further comprises an injection probe, and said means for monitoring a voltage, further comprises a monitor probe coupled to said electrically conductive shield.

4. A system of claim 3 wherein said monitor probe comprises an inductively coupled annular probe disposed around the cable.

5. A system of claim 4 wherein said injecting probe comprises an inductively coupled annular probe disposed around the cable.

6. A system of claim 5 wherein said dedicated surveillance wire is coupled at one end to said means for monitoring a voltage and coupled at an opposing end to a ground termination through a resistance which is matched to a characteristic impedance of the dedicated surveillance wire.

7. A system of claim 6 wherein said electrically conductive shield is a multi-layered conductive shield.

8. A system of claim 6 further comprising an insulating sleeve disposed around the electrically conductive shield.

9. The system of claim 1 wherein said means for monitoring a voltage further comprises a shielding surveillance module which is configured to first perform a self-test then perform surveillance of the electrically conductive shield at a plurality of frequencies.

10. The system of claim 1 wherein said first wire is a signal wire.

11. The system of claim 1 wherein said first wire is a power transmission wire.

* * * * *